United States Patent [19]
Oda et al.

[11] Patent Number: 5,644,387
[45] Date of Patent: Jul. 1, 1997

[54] HIGH-SPEED DATA REGISTER FOR LASER RANGE FINDERS

[75] Inventors: Dwight N. Oda, Rancho Santa Margarita, Calif.; Gregson D. Chinn, Oro Valley, Ariz.; Charles E. Nourrcier, Jr., Lakewood, Calif.

[73] Assignee: Hughes Electronics, Los Angeles, Calif.

[21] Appl. No.: 484,736

[22] Filed: Jun. 7, 1995

[51] Int. Cl.⁶ .............................. G01C 3/08; G11C 19/00
[52] U.S. Cl. ..................... 356/5.01; 365/189.05; 365/230.08; 377/78
[58] Field of Search ...................... 365/189.02, 189.05, 365/194, 195, 222, 230.02, 230.08; 356/5.01; 377/78

[56] References Cited

U.S. PATENT DOCUMENTS

| | | |
|---|---|---|
| 3,656,011 | 4/1972 | Weinberg . |
| 4,685,088 | 8/1987 | Iannucci ............................ 365/230 |
| 4,837,740 | 6/1989 | Sutherland . |
| 4,903,285 | 2/1990 | Knierim et al. . |
| 4,987,559 | 1/1991 | Miyauchi et al. .............. 365/189.04 |
| 5,517,461 | 5/1996 | Unno et al. ....................... 365/233 |

Primary Examiner—Mark Hellner
Attorney, Agent, or Firm—Gordon R. Lindeen, III; Michael W. Sales; Wanda K. Denson-Low

[57] ABSTRACT

A high-speed data register for storing a series of data values received at a high-speed clock rate and including a first set of pipelined latches and a second set of pipelined latches. Control circuitry loads the received data values alternately into said first set of latches and said second set of latches from an input or "last" register, which stores the last data value received by the data register. Data values thus enter the last register at the high-speed clock rate but are loaded into each of the first and second set of pipelined latches at one-half that rate.

26 Claims, 6 Drawing Sheets

HIGH-SPEED DATA REGISTER FOR LASER RANGE FINDERS

BACKGROUND OF THE INVENTION

1. Field of the Invention

The subject invention relates generally to high-speed data storage and, more particularly, to an implementation of a series of data registers in a manner permitting multiple laser range finder return storage at very high counter speeds.

2. Description of Related Art

Current state-of-the-art range counters used in laser radar only store two target returns, typically the first and last. Storing more target returns in an ultra high-speed design is problematic because the addition of more data registers in conjunction with a high-speed range counter according to conventional designs loads down the system clock and, hence, precludes reaching the high speeds of operation desired.

OBJECTS AND SUMMARY OF THE INVENTION

It is therefore an object of the invention to improve laser range finders;

It is another object of the invention to improve high-speed data storage circuitry;

It is another object of the invention to improve high-speed data register circuitry used to store target returns in laser range finders;

It is another object to increase the speed and storage capacity of target return storage circuitry of laser range finders;

It is another object to provide such circuitry which can cooperate with laser range counter circuitry of greatly increased speed and which is amenable to an integrated circuit implementation; and It is another object to provide digital laser range finder storage circuitry which is operable over a wide range of frequencies.

This invention implements a series of data registers in a unique way providing multiple return storage at very high counter speeds. Through implementation of the invention, a GaAs range counter is capable of obtaining not only the first target, but also the last seven targets, permitting the system to discriminate between smoke, dust, terrain, and real targets.

The problem of storing multiple returns in a high-speed synchronous design is particularly overcome according to the invention by using a ping-pong scheme employing first and second sets of pipelined latches, which are alternately loaded. Each set of latches need only be run at one-half the system clock rate, thereby eliminating the loading of the high-speed system clock. This approach has been implemented in a GaAs range counter design, which tests show can store the first return and the last seven target returns at frequencies greater than 1 Ghz.

This approach is particularly significant when used in imaging laser radar applications. Laser radar imaging signal processors require a data rate of 100 kHz or greater, which requires the target return latches to be double buffered. According to a further aspect of the invention, such double buffering is provided in conjunction with the ping-pong scheme, allowing an associated range counter to begin counting the next range interval while the system unloads the data from the range counter.

Computer simulations using worst case rise and fall times, worst case voltage, and worst case temperature, have verified that data registers constructed according to the invention can operate at up to 600 mHz and appears capable of operating at frequencies up to 1–2 gHz at room temperature.

Applications for circuitry designed according to the invention include automotive obstacle avoidance, and commercial and industrial ranging systems including radar and military applications. The data register design can be applied to a broad range of technologies and is not limited to laser systems.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, of which:

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the generic principles of the present invention have been defined herein specifically to provide exceptionally high-speed data register circuitry particularly suited for laser range finder applications.

DATA REGISTER STRUCTURE

Figure 1:
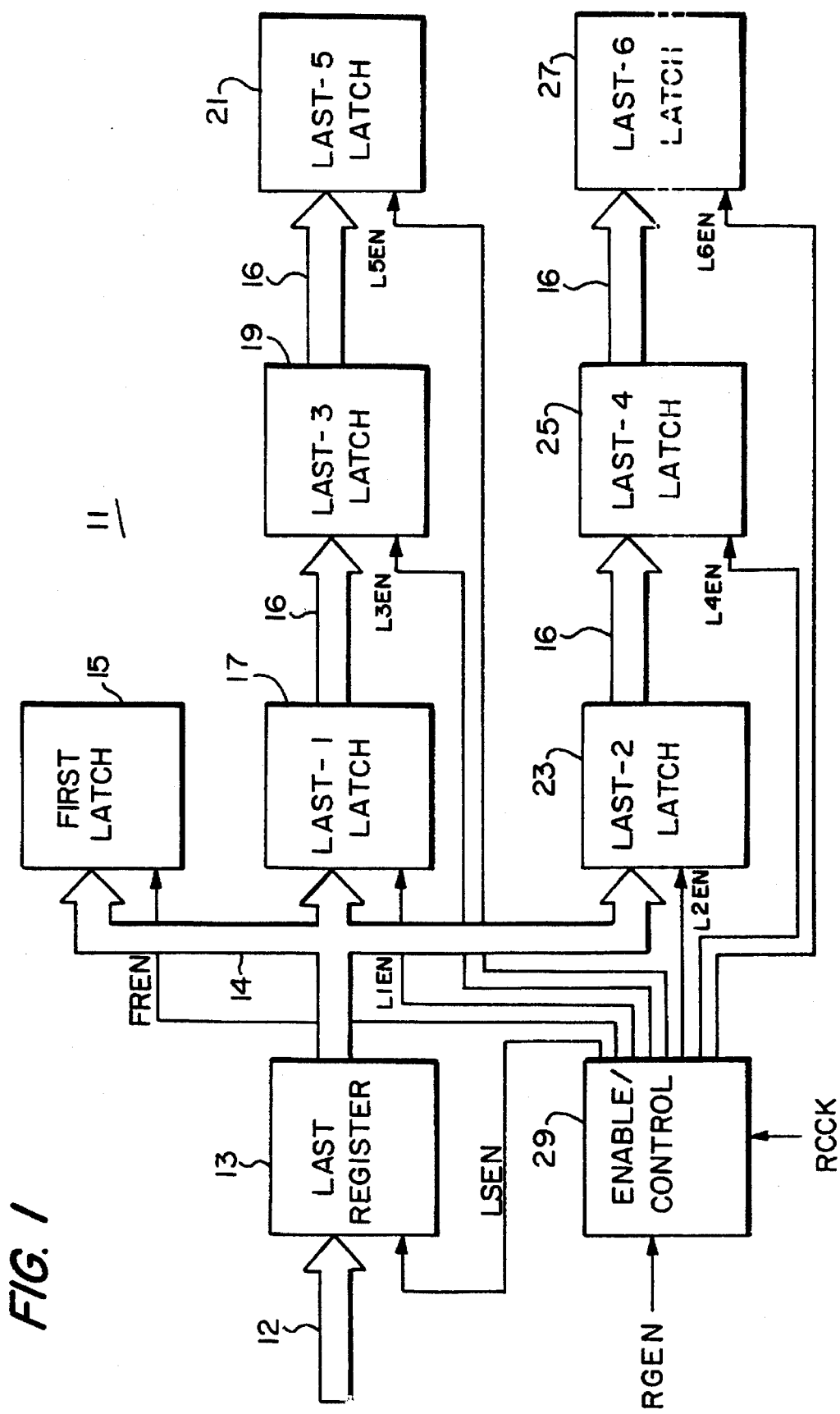
FIG. 1 is a circuit block diagram of a high-speed data register according to the preferred embodiment.

A high-speed data register 11 according to the preferred embodiment is illustrated in FIG. 1. The register 11 includes a LAST register 13, a FIRST latch 15, and a set of three odd latches including a LAST-1 latch 17, a LAST-3 latch 19, and a LAST-5 latch 21. The data register 11 further includes a set of three even latches including a LAST-2 latch 23, a LAST-4 latch 25, and a LAST-6 latch 27.

The LAST register 13 receives a parallel digital input on an input bus 12 and stores one binary digital word at any one time. In the illustrative embodiment, this word is the 16-bit wide parallel output of a laser range finder range counter, but may be any similar binary digital input of various selected widths.

A data distribution bus 14 is provided to make the contents of the LAST register 13 available in parallel to either the FIRST latch 15, the LAST-1 latch 17, or the LAST-2 latch 23. Four parallel data transfer buses 16 are provided to transfer the contents of a previous latch, e.g., the LAST-1 latch 17 in parallel to the next successive latch, e.g., the LAST-3 latch 19. The latches 15, 17, 19, 21, 23, 25, 27 in the illustrative embodiment are 16 bits wide, one word deep, and enabled to latch the data contents presented to them on their respective input and data transfer buses 14, 16 by respective latch enable signals FREN, L1EN, L2EN ... L6EN, all provided by an enable/control circuit 29. The enable/control circuit 29 further provides LAST register latch enable signals LSEN and is itself initially enabled by an initial register enable signal RGEN. The RGEN signal is provided by associated circuitry when it is desired to start operation of the high-speed data register 11.

REGISTER CONTROL CIRCUITRY

Figure 2:
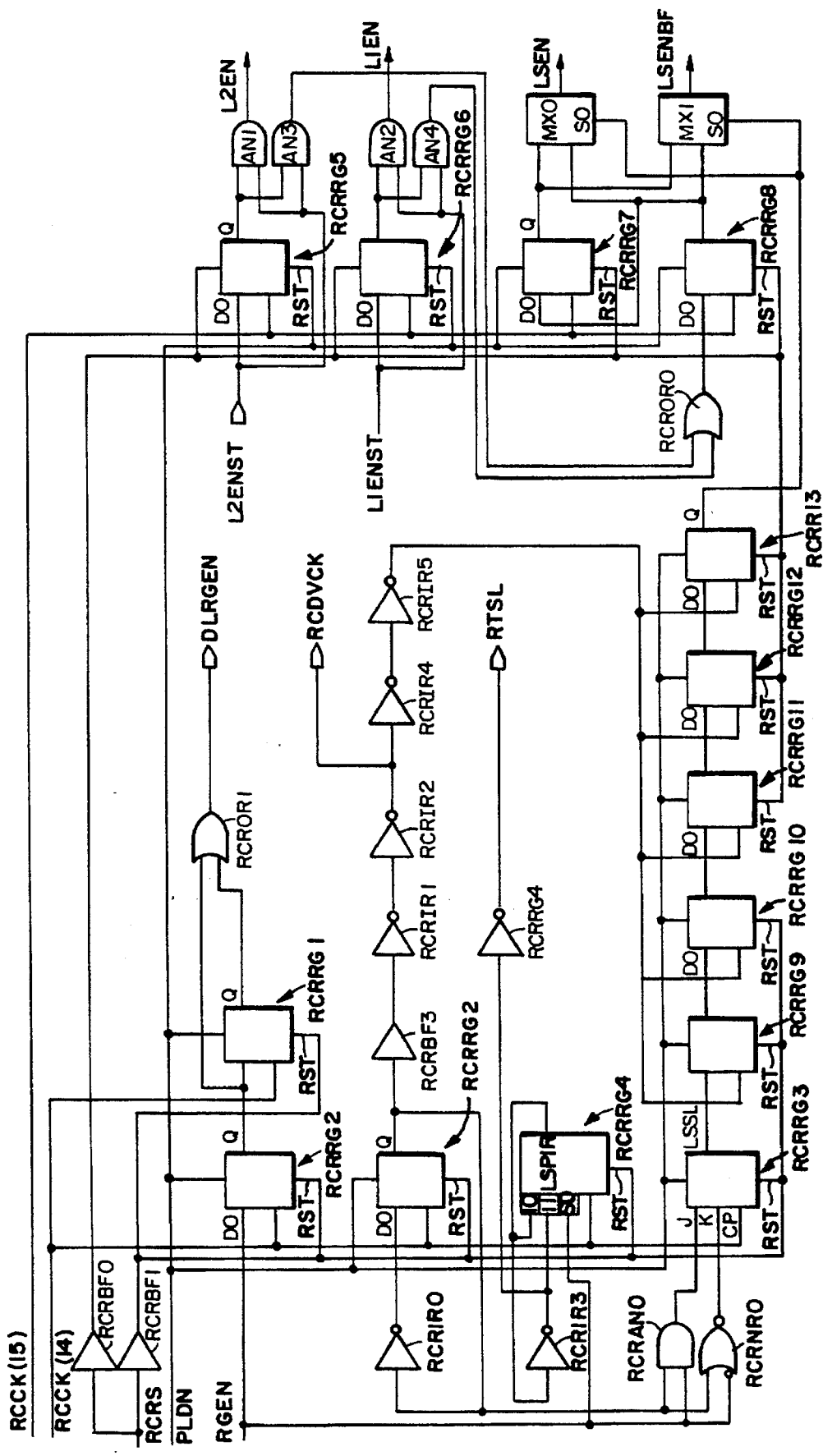
FIG. 2 is a circuit diagram of register control circuitry according to the preferred embodiment.
Figure 3:
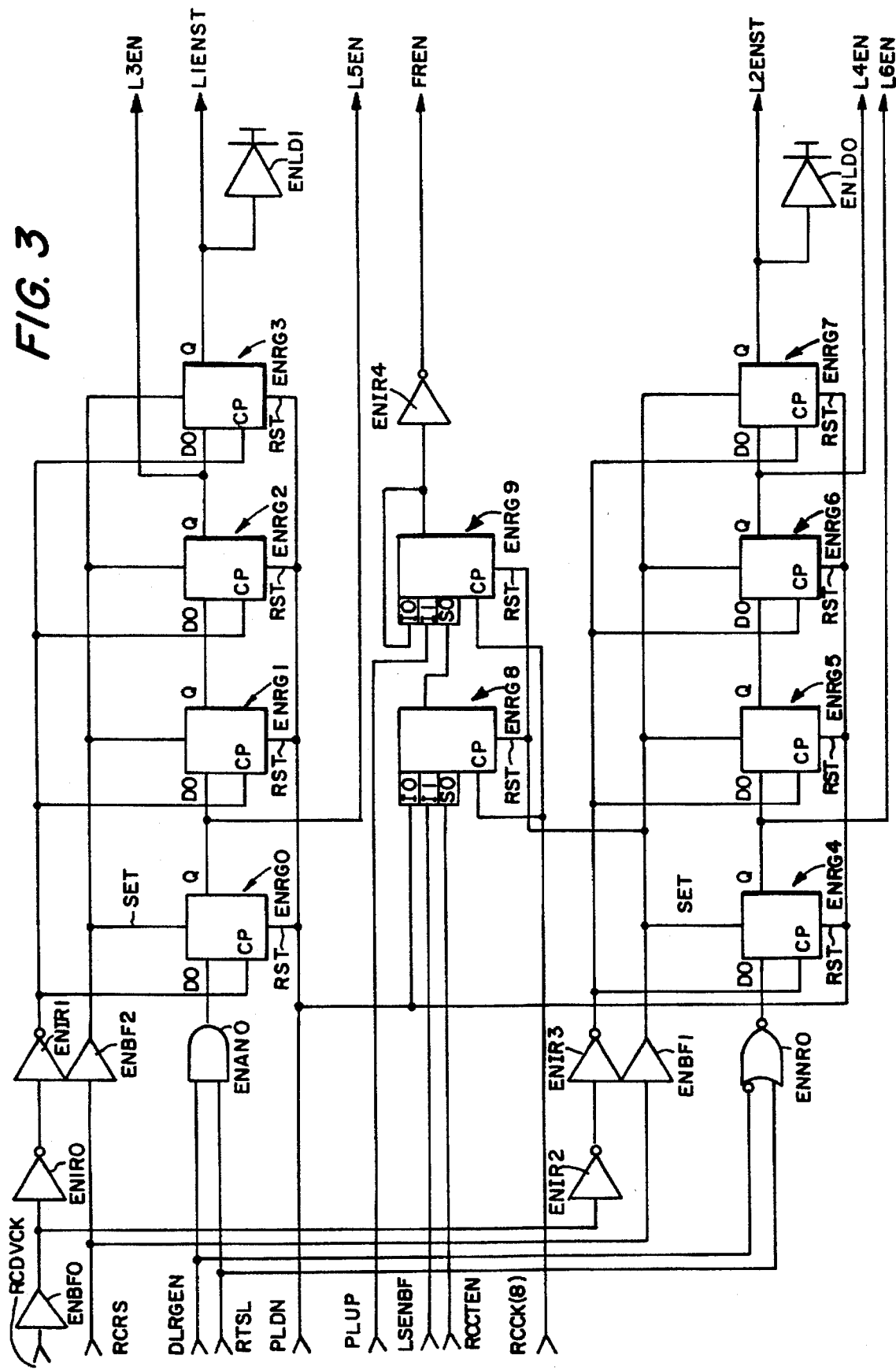
FIG. 3 is a circuit diagram of register enable circuitry according to the preferred embodiment.

The register enable/control circuitry 29 of the preferred embodiment is further illustrated in FIGS. 2 and 3. The register control circuitry illustrated in FIG. 2 receives input control signals comprising a 600 mHz register clock on lines RCCK(15) and RCCK(14), as well as a common reset signal RCRS, a common pull-down signal PLDN, the initial register enable signal RGEN, a latch 1 enable control signal L1ENST, and a latch 2 enable control signal L2ENST. The RCCK(15) and RCCK(14) clock lines are fan-outs from a 600 mHz system clock and ideally carry the same clock signal, i.e., the signal RCCK shown on the first line of FIG. 6.

Figure 4:
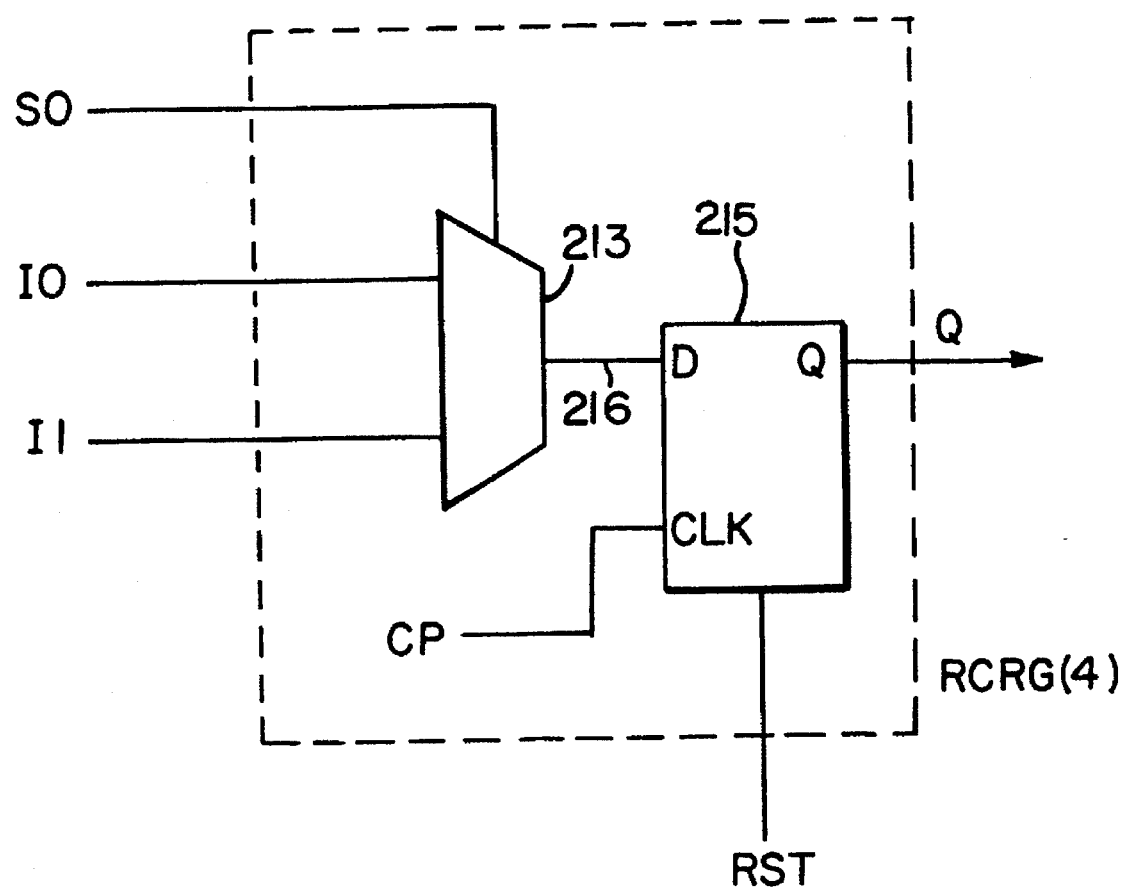
FIG. 4 is a circuit diagram of a two-to-one mux register stage according to the preferred embodiment.

The register control circuitry of FIG. 2 includes fourteen register stages RCRRG0, RCRRG1, ... RCRRG13, each of which is a D-type flip-flop or "D-register," with the exception of stages RCRRG4 and RCRRG3. Register stage RCRRG3 is a conventional JK flip-flop, while stage RCRRG4 is a two-to-one mux register stage. As shown in FIG. 4, the two-to-one mux register or logic module RCRRG4 includes a mux stage 213 and a D-type flip-flop 215. The mux stage 213 receives a select signal S0, as well as inputs "I1" and "I0," and has its output 216 connected to the "D" input of the flip-flop 215. The flip-flop 215 further receives a clock input, such as a 600 mHz clock signal on lead CP, and a reset signal on a line RST, and outputs its present contents on its Q output. The mux stage 213 functions such that if S0 is logic "1," I1 is present on line 216 on the next clock pulse, and if S0 is logic zero, I0 is present on line 216 on the next clock pulse.

Each of the register stages on the input side of the control circuitry of FIG. 2, namely, RCRRG0, RCRRG1, RCRRG2, RCRRG3, and RCRRG4, receive an input to their respective clock inputs CP from the 600 mHz register clock RCCK (14). The four D-type flip-flop register stages on the output side of the control circuitry of FIG. 2, namely RCRRG5, RCRRG6, RCRRG7, and RCRRG8, receive respective clock inputs CP from the 600 mHz register clock RCCK (15). The remaining four register stages RCRRG9, RCRRG10, RCRRG11, RCRRG12, and RCRRG13, receive clock inputs at their respective CP inputs from a clock supplied on line 31. The frequency of the clock on line 31 is one-half the frequency of RCCK, as is discussed hereafter in further detail. While the RCCK clock frequency of 600 mHz is discussed herein, the preferred embodiment is designed to operate at RCCK frequencies in the range of 0 to 600 mHz and corresponding half rates of 0 to 300 mHz.

The common reset signal RCRS is supplied to first and second buffers RCRBF0, RCRBF1, which serve to amplify the reset signal RCRS for supply to a number of the register stages. Through the outputs of these respective buffers RCRBF0, RCRBF1, the common reset signal RCRS is provided to the reset inputs RST of all of the register stages RCRRG0 ... RCRRG13, with the exception of register stages RCRRG5 and RCRRG6. In the case of these two register stages RCRRG5, RCRRG6, the common reset signal RCRS is supplied to the set inputs SET. The common pull-down signal PLDN is supplied to the reset input RST of these two flip-flops register stages RCRRG5, RCRRG6. The pull-down signal PLDN, which is a logic low or "zero" at all times, is supplied to the set inputs SET of all of the remaining register stages of the control circuitry of FIG. 2, RCRRG0 ... RCRRG4 and RCRRG7 ... RCRRG13. The various register stages RCRRG0 ... RCRRG13 are used in the generation of various control signals, as will now be described.

First, the register stages RCRRG0 and RCRRG1 are employed in generation of the control signal DLRGEN, which is a version of the initial register enable signal RGEN delayed by one RCCK clock period. To this end, the initial register enable signal RGEN is supplied to the D0 or toggle input of the register RCRRG0, whose Q output is applied to the D0 input of the subsequent register stage RCRRG1. The respective Q outputs of the register stages RCRRG0 and RCRRG1 are supplied as respective inputs to an OR gate RCROR1 whose output constitutes the DLRGEN signal.

The third register stage RCRRG2 is employed in generation of a divided clock RCDVCK, i.e., a clock which is one-half the frequency of the clock RCCK. To this end, the Q output of the register stage RCRRG2 is fed back through an inverter RCRIR0 to its D0 input, and is further fed to a buffer amplifier RCRBF3 and a series of four inverters RCRIR1 ... RCRIR5. The divided clock RCDVCK thus comprises the Q output of the third register stage RCRRG2 subjected to the delay provided by the first three stages RCRBF3, RCRIR1, RCRIR2. The RCDVCK clock is further delayed by two additional inverter stages RCRIR4 and RCRIR5 to generate the 0-300 mHz divided clock on line 31.

The fifth register stage RCRRG4 is employed to generate a control signal RTSL, which goes high if an odd number of returns have been stored by the latches 15, 17, 19, 21, 23, 25, 27 or low if an even number of returns have been stored thereby. To this end, the register RCRRG4 has its Q input fed back directly to the I0 input and through an inverter RCRIR3 to the I1 multiplexer input, and has its S0 select signal connected to the initial register enable signal line RGEN. The output of the inverter RCRIR3 is also provided to another inverter RCRIR6, whose output constitutes the RTSL control signal.

The JK flip-flop or fourth stage RCRRG3 is used to generate a control signal LSSL. To this end, the J input of the register stage RCRRG3 is supplied by an AND gate RCRAN0, while its K input is supplied by the output of a NOR gate RCRNR0. The NOR gate RCRNR0 receives respective first and second inputs from the Q output of the third register stage RCRRG2 and the initial register enable signal RGEN. The AND gate RCRAN0 also receives respective first and second inputs from the output of the third register stage RCRRG2 and the initial register enable signal RGEN. The Q output of the fourth register stage RCRRG3 constitutes the control signal LSSL, which is fed to the D0 input of the D-register RCRRG9.

The series of D-registers RCRRG9, RCRRG10 ... RCRRG13 function to generate a control signal DLLSSL, which is a delayed version of the control signal LSSL. For this purpose, the D0 input of each of the registers RCRRG10, RCRRG11, RCRRG12, RCRRG13 is connected to the Q output of the respective preceding D-register RCRRG9, RCRRG10, RCRRG11, RCRRG12. The output of the 14th register stage RCRRG13 constitutes the control signal DLLSSL, which is fed to the select inputs S0 of first and second multiplexers MX0 and MX1.

The sixth register stage RCRRG5 is employed in generation of the latch enable signal L2EN for the LAST-2 latch 23. It receives, as its D0 input, the latch 2 enable signal L2ENST from the circuitry of FIG. 3, and supplies its Q output as a respective first input of first and second AND gates AN1 and AN3.

The seventh register stage RCRRG6 is employed in generation of the latch enable signal L1EN and receives, at its D0 input, the latch 1 enable control signal L1ENST generated by the circuitry of FIG. 3. The seventh register stage RCRRG6 supplies its Q output to respective first inputs of third and fourth AND gates AN2 and AN4, whose respective second inputs constitute the latch 1 enable control signal L1ENST. The output of AND gate AN2 constitutes the latch 1 enable signal L1EN, which controls the LAST-1 latch 17 of FIG. 1.

The eighth register stage RCRRG7 is employed in generation of the LAST register enable signal LSEN. To this end, the eighth register RCRRG7 receives the Q output of the ninth register stage RCRRG8 as its D0 input and supplies its Q output to the I0 input of the first multiplexer MX0 whose second input I1 is supplied by the Q output of the ninth register stage RCRRG8. The output of the multiplexer MX0 constitutes the LAST register enable signal LSEN.

The ninth register stage RCRRG8 receives, as its D0 input, the output of an OR gate RCROR0, whose respective first and second inputs are supplied by the AND gate AN4 and the AND gate AN3. The Q output of the ninth register stage RCRRG8 is supplied as the second input I1 to the multiplexer MX1, whose first input comprises the Q output of the eighth register stage RCRRG7. The second multiplexer MX1 produces the buffered latch register enable signal LSENBF, which is supplied as one input to the register enable circuitry of FIG. 3.

REGISTER ENABLE CIRCUITRY

Considering now the register enable circuitry of FIG. 3, it will be seen that various ones of four D-register stages ENRG0, ENRG1, ENRG2, ENRG3 are employed in the generation of the latch 3 enable signal L3EN, the latch 5 enable signal L5EN, and the latch 1 enable control signal L1ENST. The Do input of register stage ENRG0 is connected to the output of an AND gate ENANO whose first and second inputs comprise the RCRS and DLRGEN signals, respectively. The respective D-register stages ENRG0 . . . ENRG3 receive respective set inputs from the RCRS signal after buffering by a buffer ENBF2 and respective reset inputs comprising the PLDN signal. These register stages ENRG0 . . . ENRG3 further receive respective clock signals on their CP inputs from a signal generated by buffering and inverting the RCDVCK via buffer ENBF0 and respective inverters ENIR0 and ENIR1, which add delay selected to minimize skew between the output of the inverter ENIR1 and that of the inverter ENIR3.

As may be further seen in FIG. 3, first and second two-to-one mux register stages ENRG8 and ENRG9 are employed to generate the enable signal FREN for the first latch 15 of FIG. 1. These respective register stages ENRG8, ENRG9 receive signals at their CP inputs from the RCCK clock and are reset by the RCRS signal provided to their reset inputs RST. The inputs I0, I1, and S0 of the mux register stage ENRG8 are respectively connected to the PLDN signal, the LSENBF signal, and the RCCTEN signal. RCCTEN is a control signal, which typically indicates that an associated range counter is counting. The second mux register stage ENRG9 has its I0, I1, and S0 inputs respectively connected to its own Q output, the PLUP signal, and the Q output of the preceding multiplexer register ENRG8 is always a logic high or "1." The Q output of the mux register stage ENRG9 is supplied to an inverting ENIR4 whose output constitutes the first register enable signal FREN.

Various ones of a second series of four D-register stages ENRG4, ENRG5, ENRG6, ENRG7 are employed in the generation of the latch 2 enable control signal L2ENST and the even register enable signals L4EN and L6EN for the LAST-4 register 25 and LAST-6 register 27, respectively. Each of these registers ENRG4 . . . ENRG7 is connected to be set by the RCRS signal provided via buffer ENBF1, reset by the PLDN signal, and clocked by the RCDVCK signal after it has been subjected to the delay of the first and second inverter stages ENIR2 and ENIR3. The first of this second group of enable register stages ENRG4 receives, as its D0 input, the output of a NOR gate ENNR0, whose respective first and second inputs comprise the DLRGEN and RTSL signals. Each of the first three of the second set of enable register stages ENRG4, ENRG5, ENRG6 supplies its Q output to the subsequent respective register stage ENRG5, ENRG6, ENRG7. The Q outputs of the respective register stages ENRG4, ENRG6, and ENRG7 comprise the respective even latch register control signals L2ENST, L4EN, and L6EN. Respective amplifiers ENLD1 and ENLD0 provide driving loads to compensate for the excessive drive capacity of the particular devices selected to implement register stages ENRG3 and ENRG7 employed in the illustrative embodiment.

Figure 5:
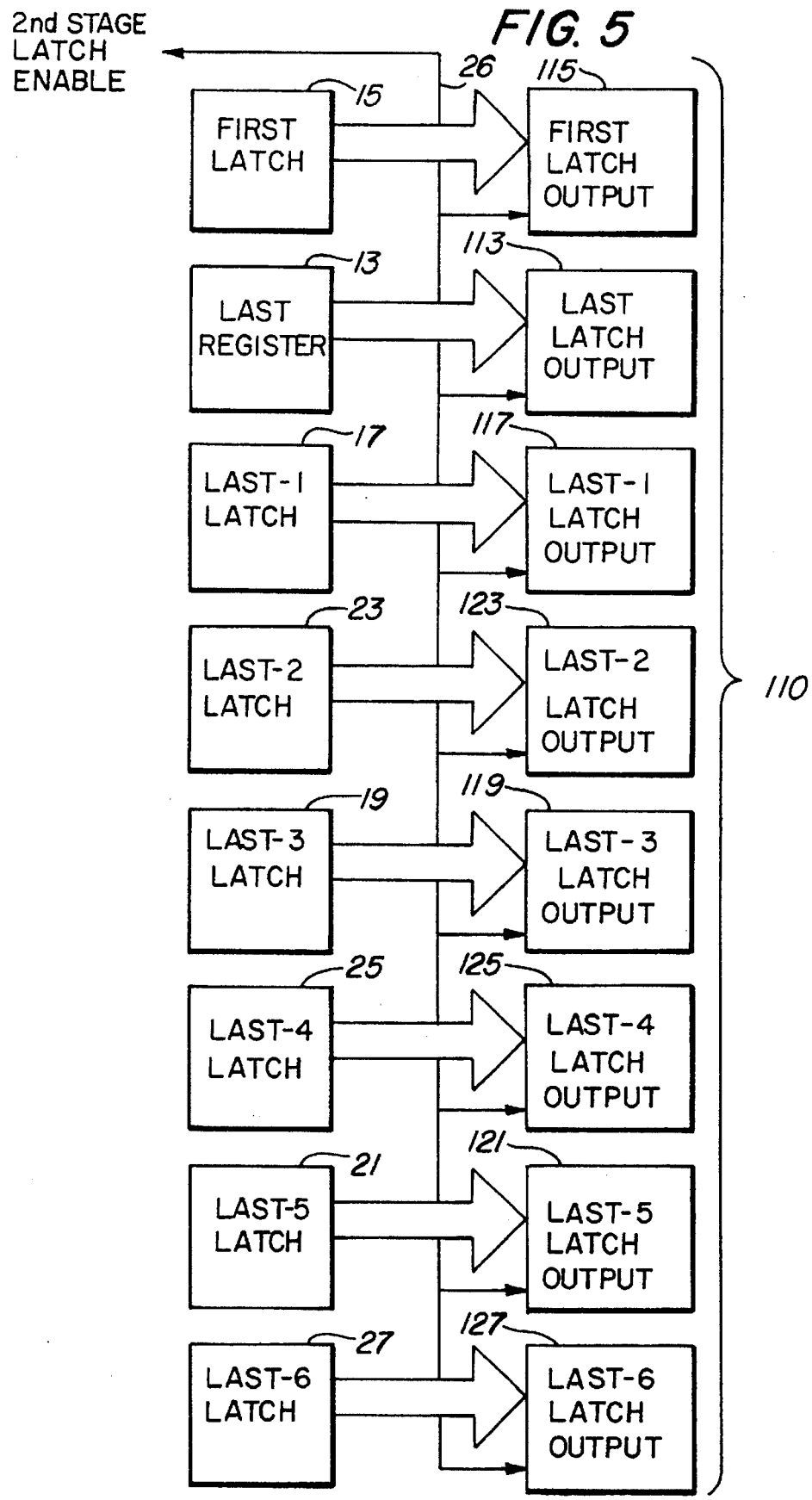
FIG. 5 is a schematic block diagram illustrating double buffering according to the preferred embodiment.

FIG. 5 illustrates optional double buffering of the contents of the high-speed data register 11, which is incorporated in the preferred embodiment. Such double buffering is provided by a second or buffer stage 110 including a number of latches 115, 113, 119, 123, 125, 121, 127, which are enabled by a second stage latch enable signal on a signal line 26 to latch and thereby duplicate the contents of corresponding latches 15, 13, 17, 23, 19, 25, 21, 27.

HIGH-SPEED DATA REGISTER OPERATION

As will be appreciated from the foregoing, the high-speed data register 11 of the preferred embodiment is 16 bits wide, 8 words deep, double buffered, and can operate at a maximum frequency of 600 mHz over temperature, using military grade GaAs-based technology. It includes the 16-bit LAST register 13 updating at the maximum frequency, seven 16-bit latches 15, 17, 19, 21, 23, 25, 27 updating at half the maximum frequency, and control circuitry 29 to generate the register and latch enables LSEN and L1EN . . . L6EN. When used in a range counter application, the data register 11 will store the first, and the last seven, return values.

To reliably operate at 600 mHz, it is necessary to update the latches 15, 17, 19, 21, 23, 25, 27 of FIG. 1 at a slower rate (300 mHz) in order to reduce the loading of the 600 mHz clock and to increase the data-to-latch enable setup time. A ping-pong scheme is effectively employed to preserve the 600 mHz resolution while updating the latches at 300 mHz. According to this scheme, on the first enable, the "even" latches, i.e., the LAST-6 latch, LAST-4 latch, and then the LAST-2 latch, are updated, in that order. On the next enable, the "odd" latches, i.e., the LAST-5 latch, LAST-3 latch, and then the LAST-1 latch, are updated, again in that order. The latches "at the bottom" are enabled first so that there are storage locations for receiving additional data and data is not lost. This ping-ponging will continue for all enables. The LAST register 13 feeds the odd and even latches and is updated after either the odd or even latches are updated. The FIRST register 15 records the first value received by the LAST register 13 and holds that value during the entire time that the odd and even latches 17, 19, 21, 23, 25, 27 are being updated. The control circuitry implements the foregoing latch loading/ordering scheme and ensures that enables are provided at the right time to the correct latches.

Figure 6:
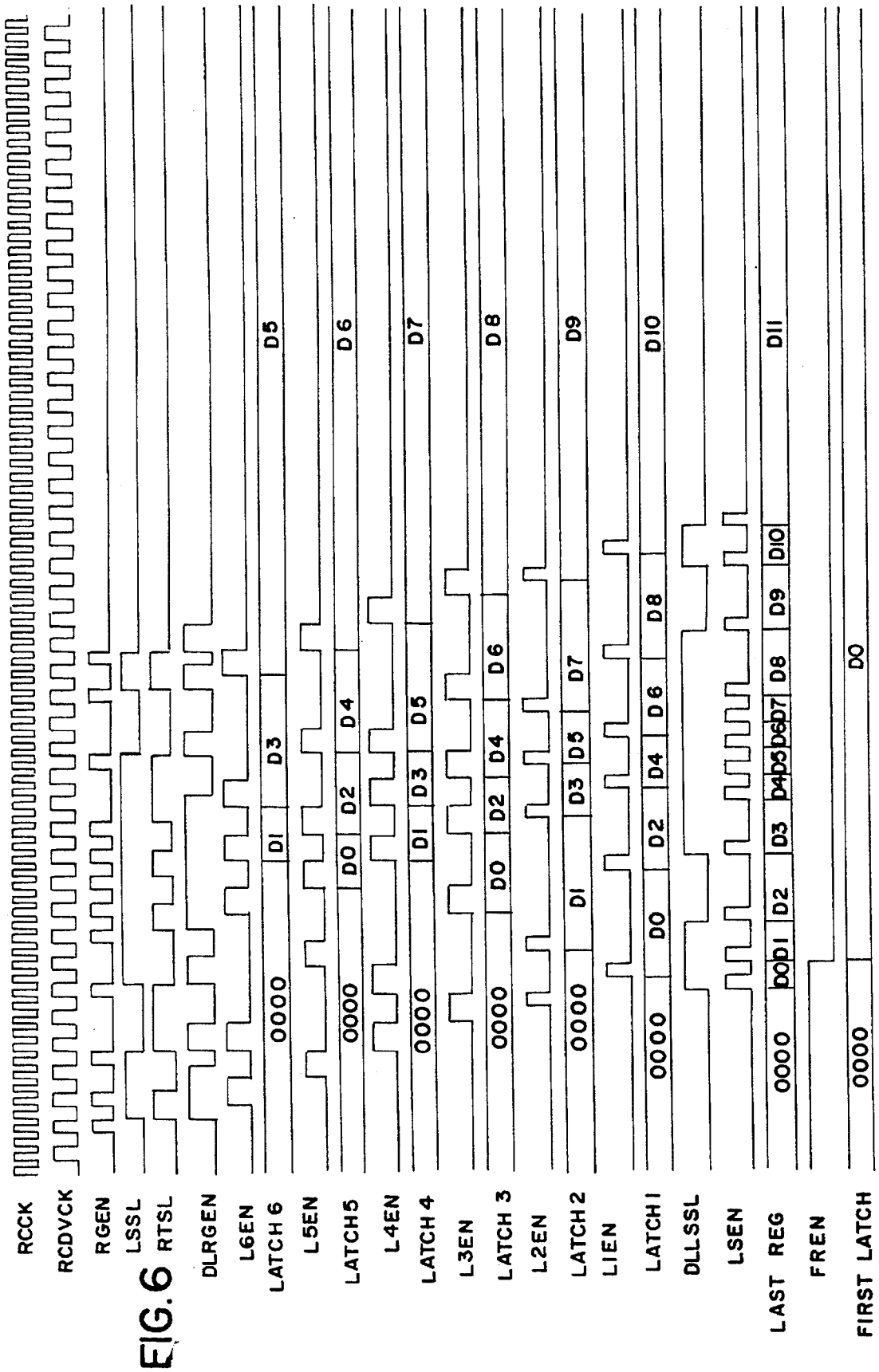
FIG. 6 is a timing diagram illustrative of operation of the preferred embodiment.

The operation of the high-speed data register 11 of FIG. 1 will now be described in more detail with particular reference to the control circuitry of FIG. 2 and the timing diagram of FIG. 6. FIG. 6 illustrates various control signals, as well as which data words D0, D1, D2, D3, D4, etc. are in which respective latch 15, 17, 19, 21, 23, 25 or register 13 at what time. It will be noted that latch enable signals are generated before generation of the control signal LSEN, but there is no data in the LAST register to propagate.

To generate the latch enable clock, RCDVCK (300 mHz, max), the system clock RCCK (600 mHz, max), is divided by 2 using the D-register RCRRG2 (FIG. 2) and the buffer RCRBF3. The register clock RCDVCK is then sent through another stage of buffers RCRIR1, RCRIR2 to ensure that its rising edge occurs after signals synchronous to the system clock RCCK have stabilized.

In a range counter chip implementation, a test is performed employing simulated returns from two known locations to determine the delay between RCDVCK and RCCK to the nearest RCCK period. For example, if the clock period is shorter than the delay of three inverters, the calibration will indicate that one more count needs to be added to the calculated range. Such information is used to calibrate the range counter for the specified frequency. This feature allows the data register 11 to operate at much higher frequencies without a loss in accuracy, since it is not limited by the RCDVCK to RCCK delay. The feature also does not require additional circuitry.

One RCCK period after the initial register enable signal RGEN goes high, the signal DLRGEN, a delayed RGEN, will go high for one period of the register clock RCDVCK. The RTSL control signal goes high if an odd number of values have been stored and goes low to indicate an even number of values have been stored. The control signal LSSL will go high if the initial register enable signal RGEN is high while the register clock RCDVDK is high, and it will go low if RGEN is high while RCDVCK is low. The control signal LSSL indicates how much delay to add going into the LAST register 13 in order to preserve system resolution.

The LSSL signal goes through a five-RCDVCK period pipelined delay provided by register stages RCRRG9 . . . RCRRG13 so that the DLLSSL signal, a delayed LSSL, will occur at the same time as the last register enable signals LSEN and LSENBF. In this way, the control signal DLLSSL can select whether the last register enable signals LSEN and LSENBF are delayed by one or two periods of the system clock RCCK. Hence, if the initial register enable signal RGEN occurs while the register clock RCDVCK is high, the last register enable signal LSEN will be delayed by just one RCCK period. Otherwise, LSEN will have a two-RCCK period delay. This adjustment keeps the number of RCCK periods between the initial register enable signal RGEN and the last register enable signal LSEN fixed, regardless of whether the initial register enable signal RGEN occurs on the rising or falling edge of the register clock RCDVCK, thus preserving system resolution.

LATCH LOADING SEQUENCE

With further reference to FIG. 3 and FIG. 4, loading of the odd latches occurs when the control signal DLRGEN goes high while the control signal RTSL is low. If DLRGEN goes high while RTSL is high, then one RCDVCK period later, L5EN, the latch 5 enable, will go high for one period of the register clock RCDVCK, passing data from the LAST-3 latch 19 into the LAST-5 latch 21. Two RCDVCK periods after this, L3EN, the latch 3 enable, will strobe high for one RCDVCK period, passing data from the LAST-1 latch 17 into the LAST-3 latch 19. One RCDVDCK period later, L1ENST, the latch 1 enable control signal, will go high for one RCDVCK period, causing L1EN, the latch 1 enable signal, to go high for one RCCK period after a delay of one RCCK period, passing data from the LAST register 13 into the LAST-1 latch 17. The last register enable signal LSEN will then pulse high for one RCCK period, either one or two RCCK periods later, depending on the state of DLLSSL, and record the new range counter output value into the LAST register 13.

The scenario is identical for the sequential loading of the latch registers under control of enable signals L6EN, L4EN, and L2EN, except that the loading sequence is started by the control signal DLRGEN going high while the control signal RTSL is low.

Lastly, FREN, the first latch enable, is active until one RCCK period after the buffered last register enable signal LSENBF occurs for the first time. Because of this timing, the FIRST latch 15 will record the first return value outputted by the range counter and then its enable FREN will stay inactive until a reset occurs. Thus, the FIRST latch 15 will always hold the first return value.

In a ranging application the second stage 110 (FIG. 5) of the data latches will be transparent. However, in an imaging application the second stage 110 will be updated at the beginning of the next firing sequence.

In either application, when the data registers are read, the first and last values will always be in the same address location. However, as a result of the ping-pong scheme, the storage locations of latch 1 and latch 2, latch 3 and latch 4, and latch 5 and latch 6 will be swapped if RTSL=1 (an odd number of returns have occurred), as reflected in the following Table I:

TABLE I

| LATCH | EVEN<br>RTSL = 0 | ODD<br>RTSL = 1 |
| --- | --- | --- |
| First Latch | First Value | First Value |
| Last Register | Last Value | Last Value |
| LAST-1 Latch | LAST-1 Value | LAST-2 Value |
| LAST-2 Latch | LAST-2 Value | LAST-1 Value |
| LAST-3 Latch | LAST-3 Value | LAST-4 Value |
| LAST-4 Latch | LAST-4 Value | LAST-3 Value |
| LAST-5 Latch | LAST-5 Value | LAST-6 Value |
| LAST-6 Latch | LAST-6 Value | LAST-5 Value |

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A data register driven by a system clock for storing a series of data values supplied at a rate of said system clock comprising:
   a last register means for receiving said data values at the rate of said system clock and for holding a last data value inputted to said last register means;
   a first set of pipelined latches;
   a second set of pipelined latches; and
   control means for loading the received data values alternately from said last register means into said first set of latches and from said last register means into said second set of latches such that each of said first and second set of latches is loaded at one-half the rate of said system clock.

2. The data register of claim 1 wherein said first set of pipelined latches includes at least three even latches connected in series and said second set of pipelined latches includes at least three odd latches connected in series.

3. The data register of claim 2 wherein said control means is operative in a first time period to update the data value stored in each of said even latches in succession beginning from the last even latch in said series to the first, and is operative in a second time period to update the data value stored in each of said odd latches in succession beginning from the last latch in said series to the first.

4. The data register of claim 3 wherein said control means is operative to cause said last register means to be updated after either of said series of even registers or said series of odd registers is updated.

5. The data register of claim 4 further including a first register means for storing the first data value received by the last register means and wherein said control means is operative to cause the first register means to store said first data value during the entire time said odd and even latches are being updated.

6. The data register of claim 4 wherein said control means generates a first control signal which has a first state if an odd number of data values have been stored by said data register and a second state if an even number of data values have been stored by said data register.

7. The data register of claim 6 wherein said control means produces respective latch enable control signals for each of said odd and even latches.

8. The data register of claim 7 wherein said control means further includes means for producing a second control signal for controlling the amount of delay employed in enabling said last register means.

9. The data register of claim 1 further including:
   a plurality of second stage latches, one corresponding respectively to said last register and to each latch of said first and second set of latches; and
   means responsive to a third control signal for transferring the contents of said last register and each latch of said first and second set of latches to the respective corresponding second stage latch.

10. The data register of claim 8 further including:
    a plurality of second stage latches, one corresponding respectively to said last register and to each latch of said first and second set of latches; and
    means responsive to a third control signal for transferring the contents of said last register and each latch of said first and second set of latches to the respective corresponding second stage latch.

11. A laser range finder for storing a series of target return data values, wherein the laser range finder supplies a plurality of target return data values to an input bus at a rate of a system clock, the laser range finder comprising:
    a last register connected to said input bus to receive successive last data values inputted to said last register at the rate of said system clock;
    a first set of pipelined latches;
    a second set of pipelined latches; and
    a control circuit having respective signal lines connected to said last register and each of said pipelined latches, said signal lines supplying respective latch loading control signals generated by said control circuit, said control circuit including digital circuit means for sequencing the production of said control signals such that the received data values are loaded out of said last register alternately into said first set of latches and into said second set of latches, each of said first and second set of latches thus being loaded at one-half the rate of said system clock.

12. The laser range finder of claim 11 wherein said first set of pipelined latches includes at least three even latches connected in series and said second set of pipelined latches includes at least three odd latches connected in series.

13. The laser range finder of claim 12 wherein said digital circuit means is operative in a first time period to sequence said control signals so as to update the data value stored in each of said even latches in succession beginning from the last even latch in said series to the first, and is operative in a second time period to sequence said control signals so as to update the data value stored in each of said odd latches in succession beginning from the last latch in said series to the first.

14. The laser range finder of claim 13 wherein said digital circuit means is further operative to update said last register after either of said series of even latches or said series of odd latches is updated.

15. The laser range finder of claim 14 further including a first register connected to the output of said last register and wherein said digital circuit means sequences production of a first control signal so as to cause the first register to store the first data value received by the last register and to maintain said first data value in said first register during the entire time said odd and even latches are being updated.

16. The laser range finder of claim 15 wherein said digital circuit means generates a second control signal which has a first state if an odd number of data values have been stored by said data register and a second state if an even number of data values have been stored by said data register.

17. The laser range finder of claim 16 wherein said latch loading control signals comprise respective latch enable control signals for each said odd and even latches.

18. The laser range finder of claim 17 wherein said digital circuit means further includes a delay circuit means for generating a third control signal to control the amount of delay used in enabling said last register.

19. The laser range finder of claim 18 further including:
    a plurality of second stage latches, one respectively corresponding to said last register and each latch of said first and second set of latches; and
    means responsive to a fourth control signal for transferring the contents of said last register and each latch of said first and second set of latches to the respective corresponding second stage latch.

20. A method of storing a plurality of range values supplied by a laser range finder, wherein the range values are supplied at a rate of a system clock, the method comprising the steps of:

storing the plurality of range values sequentially into a last register at the rate of the system clock;

loading the range values alternately from the last register into a first set of latches and from the last register into a second set of latches such that each of the first and second set of latches is loaded at one-half the rate of the system clock.

21. The method of claim 20, wherein the range values are loaded during a first time period into each of the latches in the first set of latches beginning with the last latch in the set to the first, and wherein the range values are loaded during a second time period into each of the latches in the second set of latches beginning with the last latch in the set to the first.

22. The method of claim 21, wherein a range value is stored into the last register after the range values have been loaded into either the first or second set of latches.

23. The method of claim 22, further comprising the step of:

storing a first range value stored in the last register into a first register.

24. The method of claim 23, further comprising the step of:

generating a first control signal which has a first state if an odd number of range values have been stored and a second state if an even number of range values have been stored.

25. The method of claim 24, further comprising the step of:

generating a second control signal for controlling an enable time for the last register.

26. The method of claim 23, further comprising the step of:

transferring the contents of the last register, first register, and each latch of the first and second sets of latches to a second stage set of latches.

* * * * *